United States Patent
Isik et al.

(10) Patent No.: US 7,830,177 B2
(45) Date of Patent: *Nov. 9, 2010

(54) LOW POWER OUTPUT DRIVER

(75) Inventors: Tacettin Isik, Saratoga, CA (US); Louis F. Poitras, San Ramon, CA (US); Daniel M. Clementi, Doylestown, PA (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/342,160

(22) Filed: Dec. 23, 2008

(65) Prior Publication Data

US 2009/0102513 A1 Apr. 23, 2009

Related U.S. Application Data

(63) Continuation of application No. 11/931,191, filed on Oct. 31, 2007, which is a continuation of application No. 11/234,911, filed on Sep. 26, 2005, now Pat. No. 7,342,420.

(60) Provisional application No. 60/712,804, filed on Aug. 31, 2005, provisional application No. 60/612,700, filed on Sep. 24, 2004.

(51) Int. Cl.
*H03K 19/094* (2006.01)

(52) U.S. Cl. ............................. 326/86; 326/83; 327/109

(58) Field of Classification Search .................. 326/63, 326/68, 80–83, 86–87, 115; 327/108–109, 327/112, 333
See application file for complete search history.

(56) References Cited

U.S. PATENT DOCUMENTS

| | | | |
|---|---|---|---|
| 3,495,223 | A | 2/1970 | Martin, Jr. |
| 4,084,070 | A | 4/1978 | Reed et al. |
| 4,556,805 | A | 12/1985 | Shoji |
| 4,775,844 | A | 10/1988 | Snyder |
| 4,791,314 | A | 12/1988 | Kuo et al. |
| 4,845,386 | A | 7/1989 | Ueno |

(Continued)

OTHER PUBLICATIONS

"Ground (electricity)" Wikipedia Encyclopedia; http://en.wikipedia.org/wiki/Ground_%28electricity%29; unpublished, no date.

(Continued)

*Primary Examiner*—James H. Cho
*Assistant Examiner*—Jason Crawford
(74) *Attorney, Agent, or Firm*—Panitch Schwarze, et al.

(57) ABSTRACT

A low power output driver includes one of a regulated reduced voltage source that receives a supply voltage and outputs a regulated reduced voltage that is a lower voltage than the supply voltage. The driver also includes a first driver input that receives a first logic signal, a second driver input that receives a second logic signal, a first driver output that outputs a first output signal and a second driver output that outputs a second output signal. The driver includes first, second, third and fourth n-type metal oxide semiconductor (NMOS) that are cross-connected between the reduced voltage and the first and second driver outputs or a constant voltage internal ground. When the second input is high, the second NMOS and the third NMOS are gated on, the second driver output is raised to the reduced voltage and the first driver output is pulled down to the constant voltage ground.

14 Claims, 6 Drawing Sheets

U.S. PATENT DOCUMENTS

| | | | |
|---|---|---|---|
| 4,884,165 A | 11/1989 | Kong et al. | |
| 4,987,318 A | 1/1991 | Burke et al. | |
| 5,083,051 A | 1/1992 | Whatley et al. | |
| 5,281,869 A | 1/1994 | Lundberg | |
| 5,404,051 A | 4/1995 | Kobayashi | |
| 5,424,683 A | 6/1995 | Takahashi | |
| 5,444,410 A | 8/1995 | Polhemus | |
| 5,444,446 A | 8/1995 | Gopinathan et al. | |
| 5,519,728 A | 5/1996 | Kuo | |
| 5,530,271 A | 6/1996 | Fallica | |
| 5,576,634 A | 11/1996 | Kamiya | |
| 5,604,417 A | 2/1997 | Kaminaga et al. | |
| 5,614,848 A | 3/1997 | Kaminaga et al. | |
| 5,632,019 A | 5/1997 | Masiewicz | |
| 5,721,504 A | 2/1998 | Sato | |
| 5,767,698 A | 6/1998 | Emeigh et al. | |
| 5,812,021 A | 9/1998 | Ikeda | |
| 5,880,599 A | 3/1999 | Bruno | |
| 5,939,931 A | 8/1999 | Noro | |
| 5,977,796 A * | 11/1999 | Gabara | 326/86 |
| 6,005,438 A * | 12/1999 | Shing | 330/253 |
| 6,028,467 A | 2/2000 | Burrows et al. | |
| 6,054,874 A | 4/2000 | Sculley et al. | |
| 6,111,431 A * | 8/2000 | Estrada | 326/83 |
| 6,118,302 A | 9/2000 | Turner et al. | |
| 6,191,994 B1 | 2/2001 | Ooishi | |
| 6,198,307 B1 | 3/2001 | Garlepp et al. | |
| 6,218,884 B1 * | 4/2001 | Chiu | 327/376 |
| 6,232,815 B1 | 5/2001 | Turvey | |
| 6,252,435 B1 | 6/2001 | Wu et al. | |
| 6,275,107 B1 | 8/2001 | Maeda et al. | |
| 6,281,715 B1 | 8/2001 | DeClue et al. | |
| 6,342,794 B1 | 1/2002 | Turner et al. | |
| 6,344,758 B1 | 2/2002 | Turner et al. | |
| 6,385,124 B2 | 5/2002 | Ooishi | |
| 6,414,518 B1 | 7/2002 | Patel et al. | |
| 6,429,696 B1 | 8/2002 | Kao et al. | |
| 6,437,599 B1 | 8/2002 | Groen | |
| 6,445,241 B2 * | 9/2002 | Gabara | 327/404 |
| 6,448,815 B1 | 9/2002 | Talbot et al. | |
| 6,545,531 B1 | 4/2003 | Hur | |
| 6,552,581 B1 | 4/2003 | Gabara | |
| 6,552,582 B1 * | 4/2003 | Bryan et al. | 327/108 |
| 6,570,415 B2 | 5/2003 | Chen et al. | |
| 6,590,422 B1 | 7/2003 | Dillon | |
| 6,617,888 B2 | 9/2003 | Volk | |
| 6,624,670 B2 | 9/2003 | Payne et al. | |
| 6,683,445 B2 | 1/2004 | Park | |
| 6,686,772 B2 | 2/2004 | Li et al. | |
| 6,724,222 B2 | 4/2004 | Patel et al. | |
| 6,731,135 B2 * | 5/2004 | Brunolli | 326/83 |
| 6,847,232 B2 * | 1/2005 | Tinsley et al. | 326/84 |
| 6,897,699 B1 | 5/2005 | Nguyen et al. | |
| 6,900,663 B1 * | 5/2005 | Roper et al. | 326/83 |
| 6,992,508 B2 * | 1/2006 | Chow | 326/86 |
| 7,012,450 B1 * | 3/2006 | Oner et al. | 326/86 |
| 7,129,756 B2 * | 10/2006 | Omote | 326/115 |
| 7,248,079 B2 | 7/2007 | Bhattacharya et al. | |
| 7,336,780 B2 * | 2/2008 | Lim et al. | 379/388.06 |
| 7,342,420 B2 * | 3/2008 | Isik et al. | 326/86 |
| 7,358,772 B1 | 4/2008 | Chen et al. | |
| 2002/0120878 A1 | 8/2002 | Lapidus | |
| 2002/0135404 A1 | 9/2002 | Payne et al. | |
| 2002/0190770 A1 | 12/2002 | Yin et al. | |
| 2003/0117174 A1 | 6/2003 | Patel et al. | |
| 2003/0146792 A1 | 8/2003 | Ausserlechner | |
| 2004/0145361 A1 | 7/2004 | Owen | |
| 2004/0150430 A1 | 8/2004 | Li et al. | |
| 2005/0285629 A1 | 12/2005 | Hein et al. | |

OTHER PUBLICATIONS

"Vcc Vdd, Vss, etc.;" E. Seale, W. Ritger; http://enclyclobeamia.solarbotics.net/articles/vss.html; Jul. 11, 2003.

* cited by examiner

LOW POWER OUTPUT DRIVER

CROSS-REFERENCE TO RELATED APPLICATIONS

This application is a continuation application of U.S. patent application Ser. No. 11/931,191, filed Oct. 31, 2007, currently pending, entitled "Low Power Output Driver," which is a continuation application of U.S. patent application Ser. No. 11/234,911, filed Sep. 26, 2005 entitled "Low Power Output Driver," now U.S. Pat. No. 7,342,420, which claims the benefit of U.S. Provisional Patent Application No. 60/712,804, filed Aug. 31, 2005, entitled "Low Power Output Driver," and U.S. Provisional Patent Application No. 60/612,700, filed Sep. 24, 2004, entitled "Low Power Output Driver," the contents of all of which are incorporated by reference herein.

BACKGROUND OF THE INVENTION

The present invention relates generally to an output driver, and more particularly, to a low power output driver utilizing voltage lower than the supply voltage or rail voltage.

Integrated circuits which have output drivers for clock and data are known in the art. A typical prior art configuration is formed with two pairs of complementary metal oxide semiconductors (CMOS) such as the circuit depicted in FIG. 3 (e.g., an inverted CML). The CMOS can be either n-type or p-type devices. The configuration shown includes a p-type CMOS over an n-type CMOS for each CMOS pair. The n-type CMOS are not really doing anything active, as shown, but are provided for ESD protection. The supply voltage ($V_{DD}$) or rail voltage is applied to the supply of the drivers and to the CMOS pairs. Each CMOS pair is connected to a pad. A series resistor $R_S$ is connected between each of the pads and a respective transmission line to "decouple" the output capacitance of the driver from the transmission line itself, i.e., it makes the impedance at the source of the transmission line more purely resistive. A termination resistor $R_T$ is connected between the junction of the series resistor $R_S$ and transmission line $T_L$ and ground to create a fixed impedance. Typically, a current mirror circuit is connected between the rail voltage and the high side of the CMOS pairs. The current mirror is driven or controlled by a reference current $I_{REF}$. The power consumption of this prior art circuit is primarily determined by the current constantly being sourced through one or the other terminating resistors $R_T$. The power can be calculated as $P=V*I=V_{DD}*(N*I_{REF})$. A typical current draw through the current mirror is on the order of 14-15 mA. With about 50 ohm terminating resistors $R_T$, the resulting voltage drop across each terminating resistor $R_T$ is on the order of 750 millivolts (mV). Thus, the power draw, independent of the load condition, is about 50 milliwatts (mW). Since one CMOS pair or the other is always connected to one of the pads, power is constantly dissipated using the conventional circuit due to the bleeding current through the respective terminating resistor $R_T$.

It is desirable to provide a driver output that utilizes a reduced voltage supply and has lower power consumption. It is also desirable to provide an on-chip reduced voltage power supply or regulator in combination with a plurality of low power output drivers.

BRIEF SUMMARY OF THE INVENTION

Briefly stated, the present invention comprises a low power output driver that includes one of a series-regulated and a switching-mode-regulated reduced voltage source. The reduced voltage source receives a supply voltage and outputs a regulated reduced voltage that is a lower voltage than the supply voltage. The driver also includes a first driver input that receives a first logic signal, a second driver input that receives a second logic signal, a first driver output that outputs a first output signal and a second driver output that outputs a second output signal. The driver includes first, second, third and fourth n-type metal oxide semiconductor (NMOS). The source and the drain of the first NMOS are electrically coupled between the reduced voltage $V_L$ and the first driver output. The gate of the first NMOS is electrically coupled to the first driver input. The source and the drain of the second NMOS are electrically coupled between the first driver output and a constant voltage internal ground. The gate of the second NMOS is electrically coupled to the second driver input. The source and the drain of the third NMOS are electrically coupled between the reduced voltage $V_L$ and the second driver output. The gate of the third NMOS is electrically coupled to the second driver input. The source and the drain of the fourth NMOS are electrically coupled between the second driver output and the constant voltage internal ground. The gate of the fourth NMOS is electrically coupled to the first driver input. When the first driver input is high and the second driver input is low, the first NMOS and the fourth NMOS are gated on, the first driver output is raised to the reduced voltage and the second driver output is pulled down to the constant voltage internal ground. When the second input is high and the first driver input is low, the second NMOS and the third NMOS are gated on, the second driver output is raised to the reduced voltage and the first driver output is pulled down to the constant voltage internal ground. The constant voltage internal ground differentiates the driver output raised to the reduced voltage from the driver output pulled down to the constant voltage internal ground.

Another embodiment of the present invention comprises a low power output driver that includes one of a series-regulated and a switching-mode-regulated reduced voltage source. The reduced voltage source receives a supply voltage and outputs a regulated reduced voltage that is a lower voltage than the supply voltage. The driver also includes a first driver input that receives a first logic signal, a second driver input that receives a second logic signal, a first driver output that outputs a first output signal and a second driver output that outputs a second output signal. A single-ended load is connected to both the first driver output and the second driver output. The driver includes first, second, third and fourth n-type metal oxide semiconductor (NMOS). The source and the drain of the first NMOS are electrically coupled between the reduced voltage $V_L$ and the first driver output. The gate of the first NMOS is electrically coupled to the first driver input. The source and the drain of the second NMOS are electrically coupled between the first driver output and an internal ground. The gate of the second NMOS is electrically coupled to the second driver input. The source and the drain of the third NMOS are electrically coupled between the reduced voltage $V_L$ and the second driver output. The gate of the third NMOS is electrically coupled to the second driver input. The source and the drain of the fourth NMOS are electrically coupled between the second driver output and the internal ground. The gate of the fourth NMOS is electrically coupled to the first driver input. When the first driver input is high and the second driver input is low, the first NMOS and the fourth NMOS are gated on, the first driver output is raised to the reduced voltage and the second driver output is pulled down to the internal ground. When the second input is high and the first driver input is low, the second NMOS and the third NMOS are gated on, the second driver output is raised to the reduced voltage and the first driver output is pulled down to the internal ground.

BRIEF DESCRIPTION OF THE SEVERAL VIEWS OF THE DRAWINGS

The foregoing summary, as well as the following detailed description of preferred embodiments of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1:
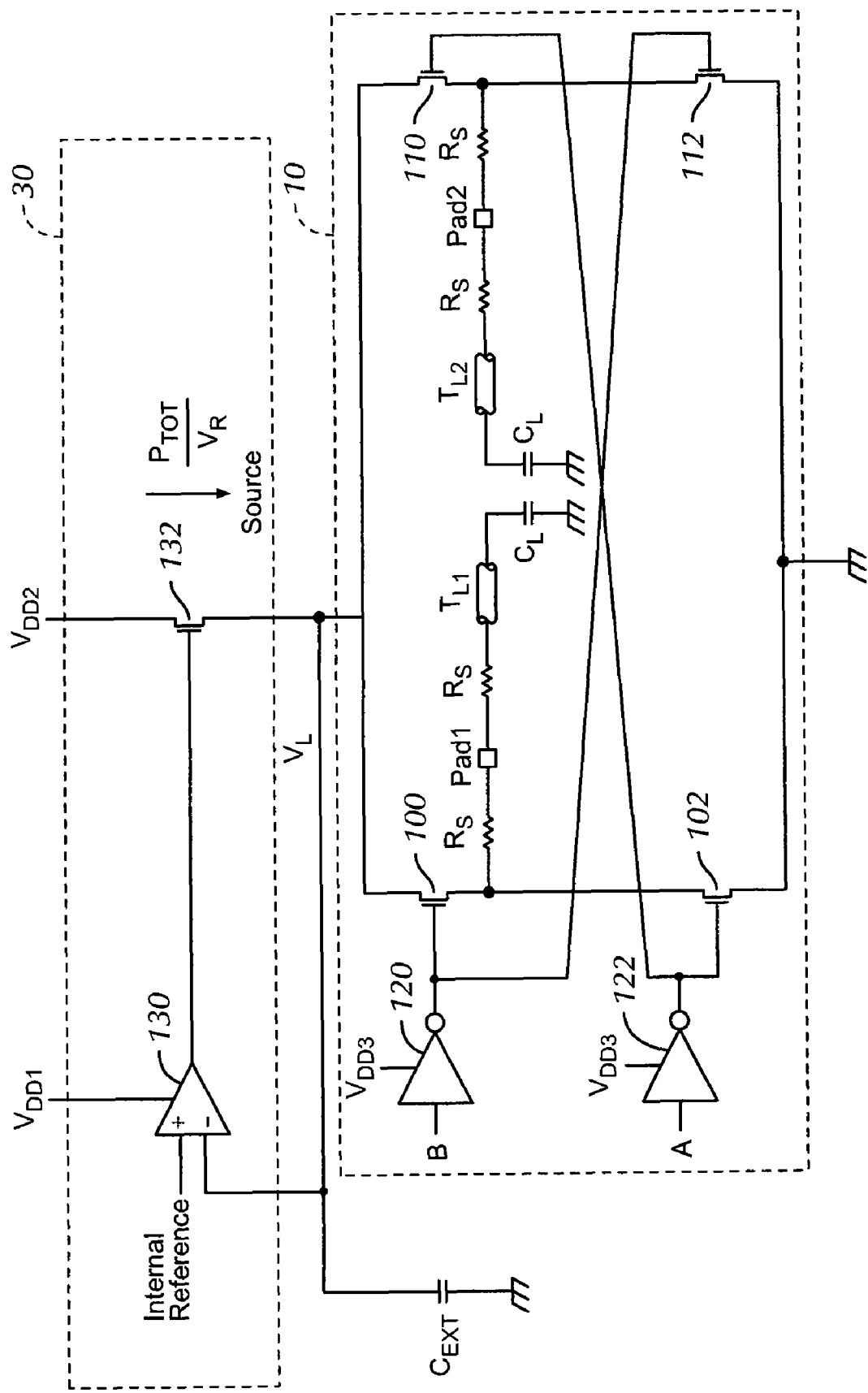
FIG. 1 is an electrical schematic diagram of a low power output driver and reduced voltage power supply in accordance with a first preferred embodiment of the present invention.

Certain terminology is used in the following description for convenience only and is not limiting. The words "right," and "left," "lower," and "upper" designate directions in the drawings to which reference is made. The words "inwardly" and "outwardly" refer to directions toward and away from, respectively, the geometric center of the object discussed and designated parts thereof. The terminology includes the words above specifically mentioned, derivatives thereof and words of similar import. Additionally, the word "a" is used in the claims and in the corresponding portions of the Specification, means "at least one."

Referring to the drawings in detail, wherein like reference numerals indicate like elements throughout, there is shown in FIG. 1 is an electrical schematic diagram of a low power output driver 10 and reduced voltage power supply 30 in accordance with a first preferred embodiment of the present invention. In the presently preferred embodiment, the reduced voltage power supply 30 is within the same integrated circuit (IC) (not shown) as the low power output driver 10. Preferably, one reduced voltage power supply 30 will supply a plurality of low power output drivers 10 all on the same IC (i.e., on the same chip). The reduced voltage power supply 30 is one of a series-regulated power supply and a switching-mode-regulated power supply.

The reduced voltage power supply 30 receives power from an external power source such as an supply voltage ($V_{DD}$) (i.e., the rail voltage). As shown, an operational amplifier (op-amp) 130 receives an internal reference current on its non-inverting input and outputs a signal to a field effect transistor (FET) 132. The internal reference may be a bandgap reference, a resistance voltage divider, an external reference, an external bandgap and the like. The FET 132 then provides a reduced voltage output $V_L$ to a high-side of the low power output driver 10 and also as a feedback to the inverting input of op-amp 130. For example, a $V_{DD}$ of 3.3 volts may be controlled down to about 750 mV. Of course, other voltage reducing configurations may be utilized without departing from the present invention. For example the FET 132 may instead be a bipolar transistor and the like. An external capacitor $C_{EXT}$ is coupled between the feedback voltage and ground to reduce line-noise, ripple and the like. Alternately, the external capacitor $C_{EXT}$ can be formed internally without departing from the present invention.

The low power output driver 10 includes four n-type MOS (NMOS) 100, 102, 110, 112. The NMOS are configured in alternate pairs 100, 102 and 110, 112 that are coupled to PAD1 and PAD2, respectively. One NMOS 100 of the first pair 100, 102 is coupled between the reduced voltage source $V_L$ and the first pad PAD1 and the other NMOS 102 of the first pair 100, 102 is coupled between the first pad PAD1 and an internal ground. Likewise, one NMOS 110 of the second pair 110, 112 is coupled between the reduced voltage source $V_L$ and the second pad PAD2 and the other NMOS 112 of the second pair 110, 112 is coupled between the second pad PAD2 and an internal ground.

Whenever NMOS 100 is on, PAD1 is pulled up to the reduced voltage $V_L$ and NMOS 112 necessarily pulls PAD2 to ground (i.e., a cross-wire configuration). Similarly, whenever NMOS 110 is on, PAD2 is pulled up to the reduced voltage $V_L$ and NMOS 102 necessarily pulls PAD1 to ground. When a particular pad PAD1, PAD2 is pulled high, the reduced voltage $V_L$, there is a current draw until the pad PAD1, PAD2 reaches a quiescent voltage with reduced voltage $V_L$. But, there is not a continuous draw of current to ground as in the case of a system with terminating resistors.

Thus, the low power output driver 10 includes one of a series-regulated and a switching-mode-regulated reduced voltage source 30. There is a first supply voltage $V_{DD1}$ that provides power for devices such as operational amplifiers 130 and the like. The first supply voltage $V_{DD1}$ may be 1.2 VDC, 1.5 VDC, 3.3 VDC, 5 VDC or the like. The reduced voltage source 30 receives a second supply voltage $V_{DD2}$ and outputs a regulated reduced voltage $V_L$ that is a lower voltage than the second supply voltage $V_{DD2}$. The second supply voltage $V_{DD2}$ may be the same as the first supply voltage $V_{DD1}$, may be derived from the first supply voltage $V_{DD1}$ or may be from a completely separate source. For example, the second supply voltage $V_{DD2}$ may be derived from a linear or switching power supply (not shown) that receives the first supply voltage $V_{DD1}$ and outputs a regulated voltage that is less than or greater than the first supply voltage $V_{DD1}$. The driver 10 also includes a first driver input B that receives a first logic signal, a second driver input A that receives a second logic signal, a first driver output PAD1 that outputs a first output signal and a second driver output PAD2 that outputs a second output signal. The first and second driver inputs B, A may be applied through an amplifier, buffer or logic gate 120, 122, respectively. Supply power for the buffers 120, 122 is provided by a third supply voltage $V_{DD3}$. The third supply voltage $V_{DD3}$ may be the same as the first supply voltage $V_{DD1}$, may be derived from the first supply voltage $V_{DD1}$ or may be from a completely separate source. Preferably, the third supply voltage $V_{DD3}$ is greater than the reduced voltage $V_L$. The driver 10 includes first, second, third and fourth NMOS 100, 102, 110, and 112, respectively. The source and the drain of the first NMOS 100 are electrically coupled between the reduced voltage $V_L$ and the first driver output PAD1. The gate of the first NMOS 100 is electrically coupled to the first driver input B. The source and the drain of the second NMOS 102 are electrically coupled between the first driver output PAD1 and an internal ground. The gate of the second NMOS 102 is electrically coupled to the second driver input A. The source and the drain of the third NMOS 110 are electrically coupled between the reduced voltage $V_L$ and the second driver output PAD2. The gate of the third NMOS 110 is electrically coupled to the second driver input A. The source and the drain of the fourth NMOS 112 are electrically coupled between the second driver output PAD2 and the internal ground. The gate of the fourth NMOS 112 is electrically coupled to the first driver input B. When the first driver input B is high and the second driver input A is low, the first NMOS 100 and the fourth NMOS 110 are gated on, the first driver output PAD1 is raised to the reduced voltage $V_L$ and the second driver output PAD2 is pulled down to the internal ground. When the second driver input A is high and the first driver input B is low, the second NMOS 102 and the third NMOS 110 are gated on, the second driver output PAD2 is raised to the reduced voltage $V_L$ and the first driver output PAD1 is pulled down to the internal ground.

The first and second pads PAD1, PAD2 are typically coupled to transmission lines $T_L$ through series resistors $R_S$. The series resistance $R_S$ may be internal (before the pads PAD1, PAD2) or external (after the pads PAD1, PAD2). The series resistance $R_S$ may simply be the load of the wire depending on the application. The series resistance $R_S$ are normally used to increase the total impedance of the driver circuit 10, including the transistor resistance plus the series resistance $R_S$ to match the impedance of the transmission lines $T_{L1}$, $T_{L2}$.

Driver inputs A and B may be clocks or data and the like. Each driver input A, B is connected to an NMOS pair 100, 102 or 110, 112.

Figure 2:
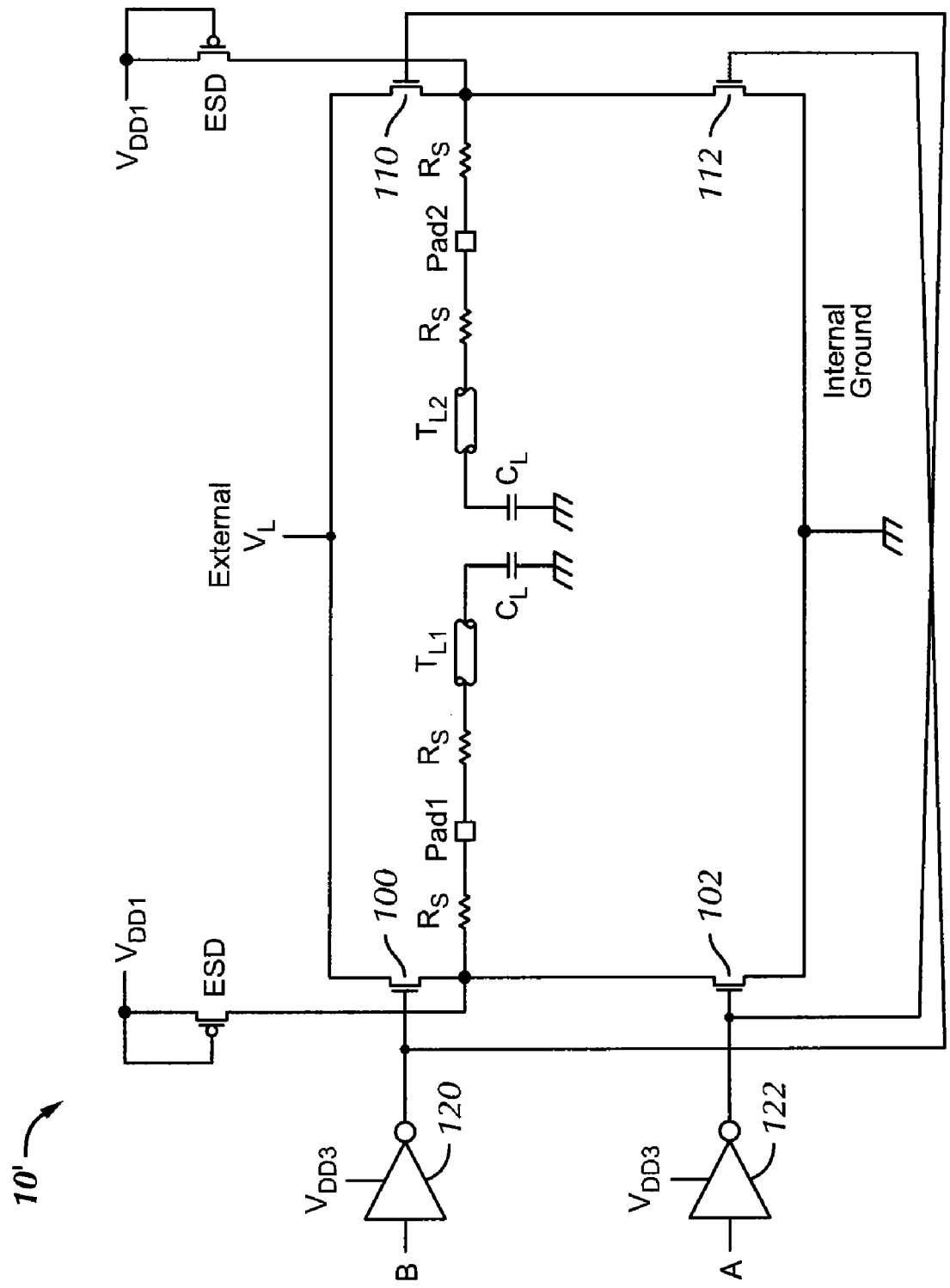
FIG. 2 is an electrical schematic diagram of a low power output driver with an external reduced voltage supply in accordance with a second preferred embodiment of the present invention.
Figure 3:
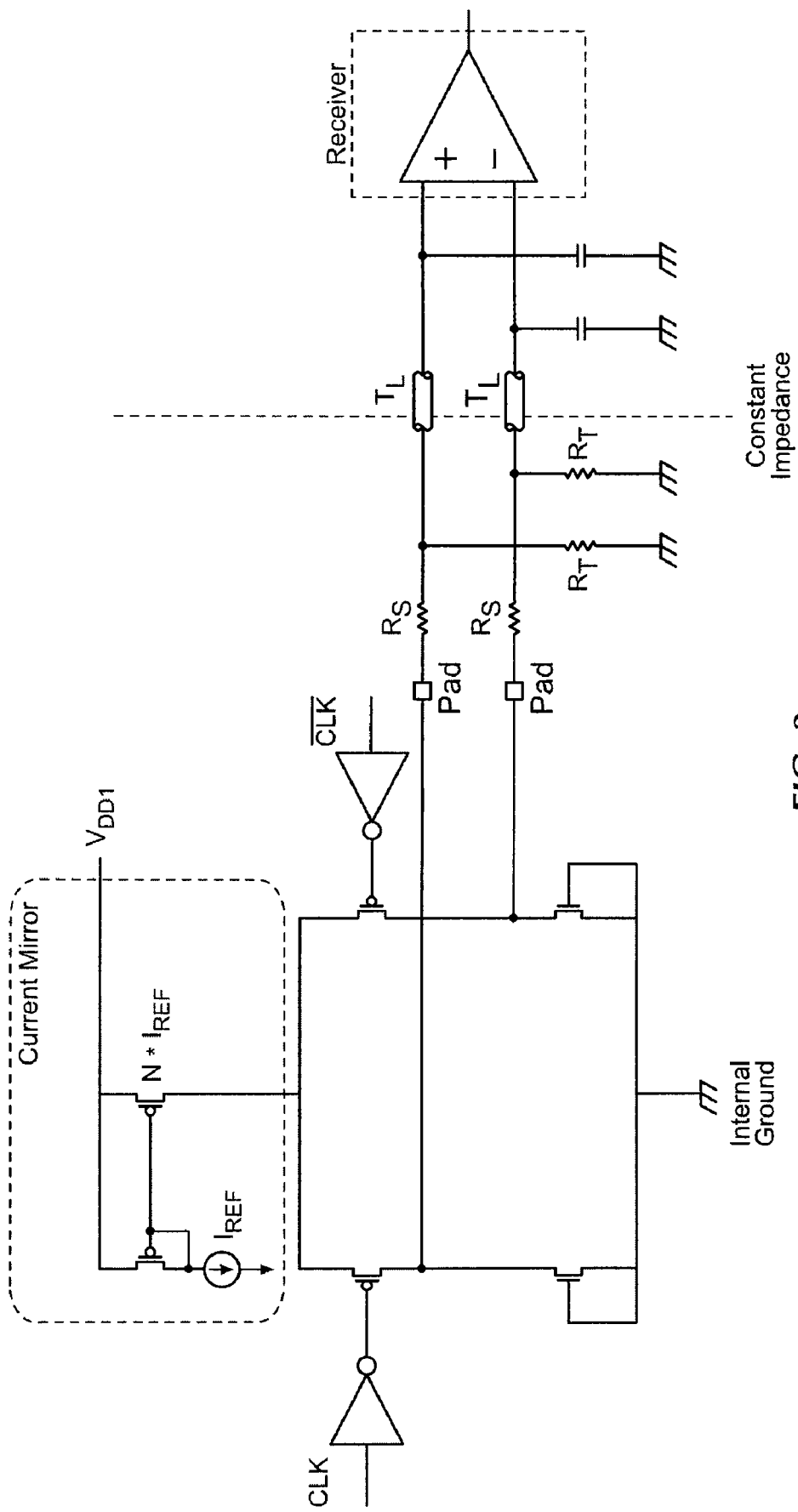
FIG. 3 is an electrical schematic diagram of prior art output driver.

FIG. 2 is an electrical schematic diagram of a low power output driver 10' with an external reduced voltage supply EXTERNAL $V_L$ in accordance with a second preferred embodiment of the present invention. The low power output driver 10' is substantially similar in functionality to that described above. The external reduced voltage supply EXTERNAL $V_L$ is from any reduced voltage source that is external to the driver IC such as an external series-regulated power supply or an external switching-mode-regulated power supply.

The resulting power consumption for the depicted system in FIG. 2 is:

$$P = V_L * I_{AVERAGE} = V_L^2 * C_L * f \quad \text{(Eq. 1)}$$

where $f$ is operating frequency.

For a reduced voltage of 0.75 volts and a $V_{DD2}$ of 3.3 volts, there is enough "enhancement" to pull the output pads PAD1, PAD2 to the reduced voltage of $V_L$.

An advantage of the present invention over a PMOS-NMOS (i.e., a complementary MOS pair or CMOS) output is that, although NMOS can be driven by 3.3 volts, PMOS would see only −0.7 volts, assuming that its gates cannot be driven below ground, which would result in minimal enhancement or possibly none at all. Therefore, an NMOS-NMOS with reduced voltage supply $V_L$ is more stable and makes reduced power consumption possible.

Figure 4A:
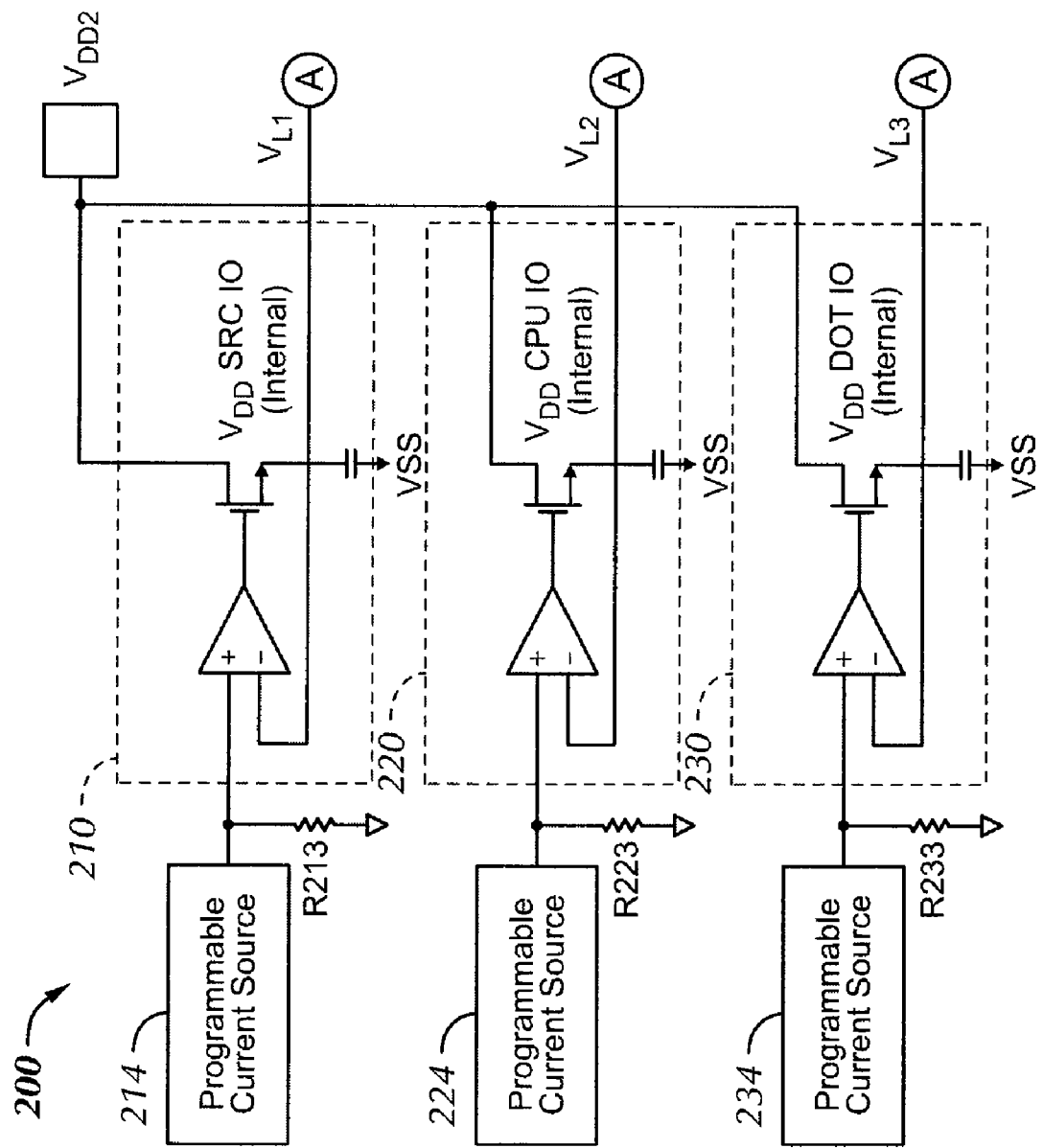
FIGS. 4A-4B are electrical schematic diagrams of a low output power driver system in accordance with a third preferred embodiment of the present invention.
Figure 4B:
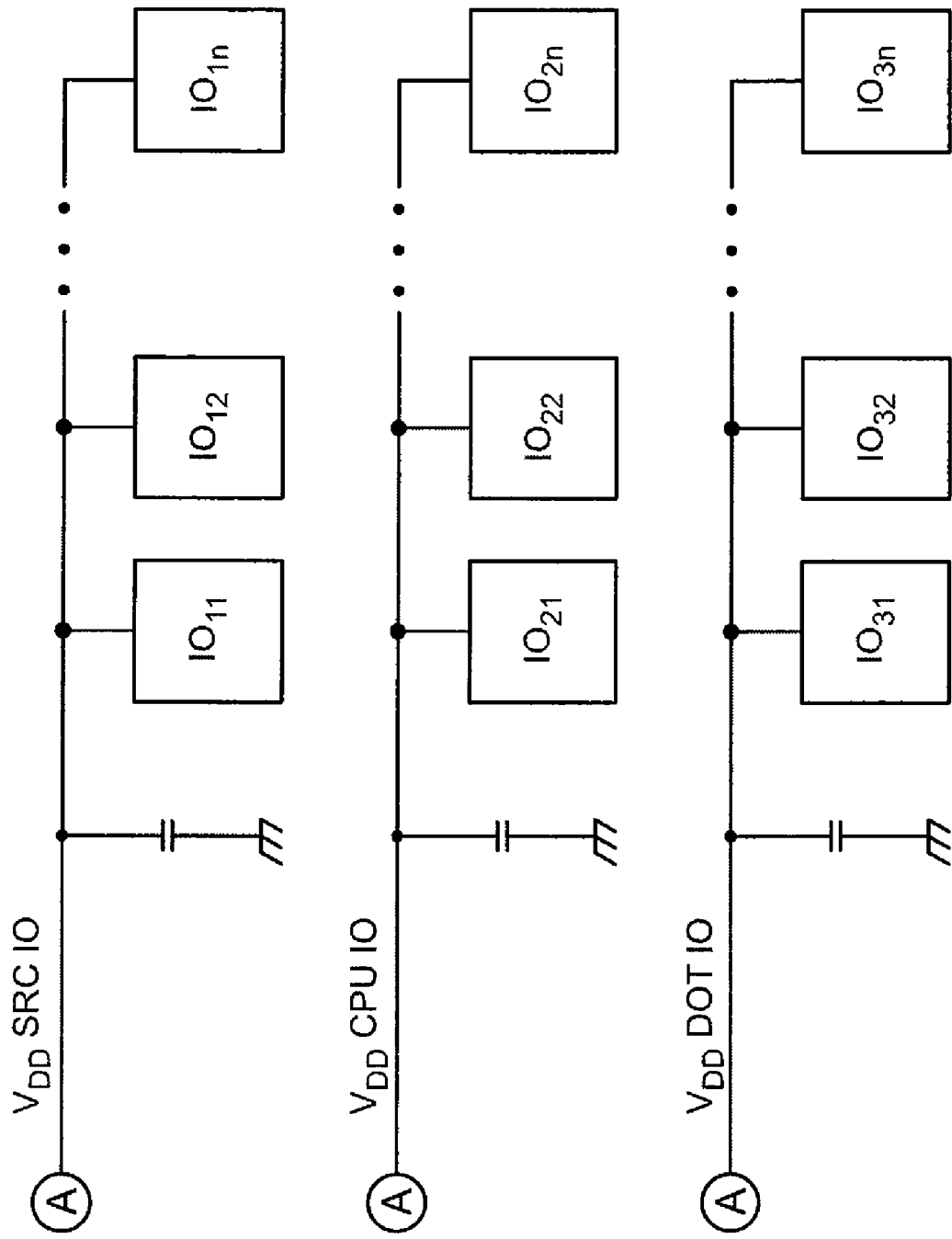

FIGS. 4A-4B show a low output power driver system 200 in accordance with a third preferred embodiment of the present invention. The low power output driver system 200 includes a reference voltage supply $V_{REF}$, a first programmable current source 214, a second programmable current source 224 and a third programmable current source 234. The first programmable current source 214 receives the reference supply voltage $V_{REF}$ and outputs a first reference voltage $V_{REF1}$. The second programmable current source 224 receives the reference supply voltage $V_{REF}$ and outputs a second reference voltage $V_{REF2}$. The third programmable current source 234 receives the reference supply voltage $V_{REF}$ and outputs a third reference voltage $V_{REF3}$. Each of the first, second and third programmable current sources 214, 224, 234 may have suitable bias components associated therewith such as resistors R213, R223 and R233, respectively. The first, second and third programmable current sources 214, 224, 234 may include a simple resistor divider network and switch, amplifiers, transistors or the like.

Figure 5:
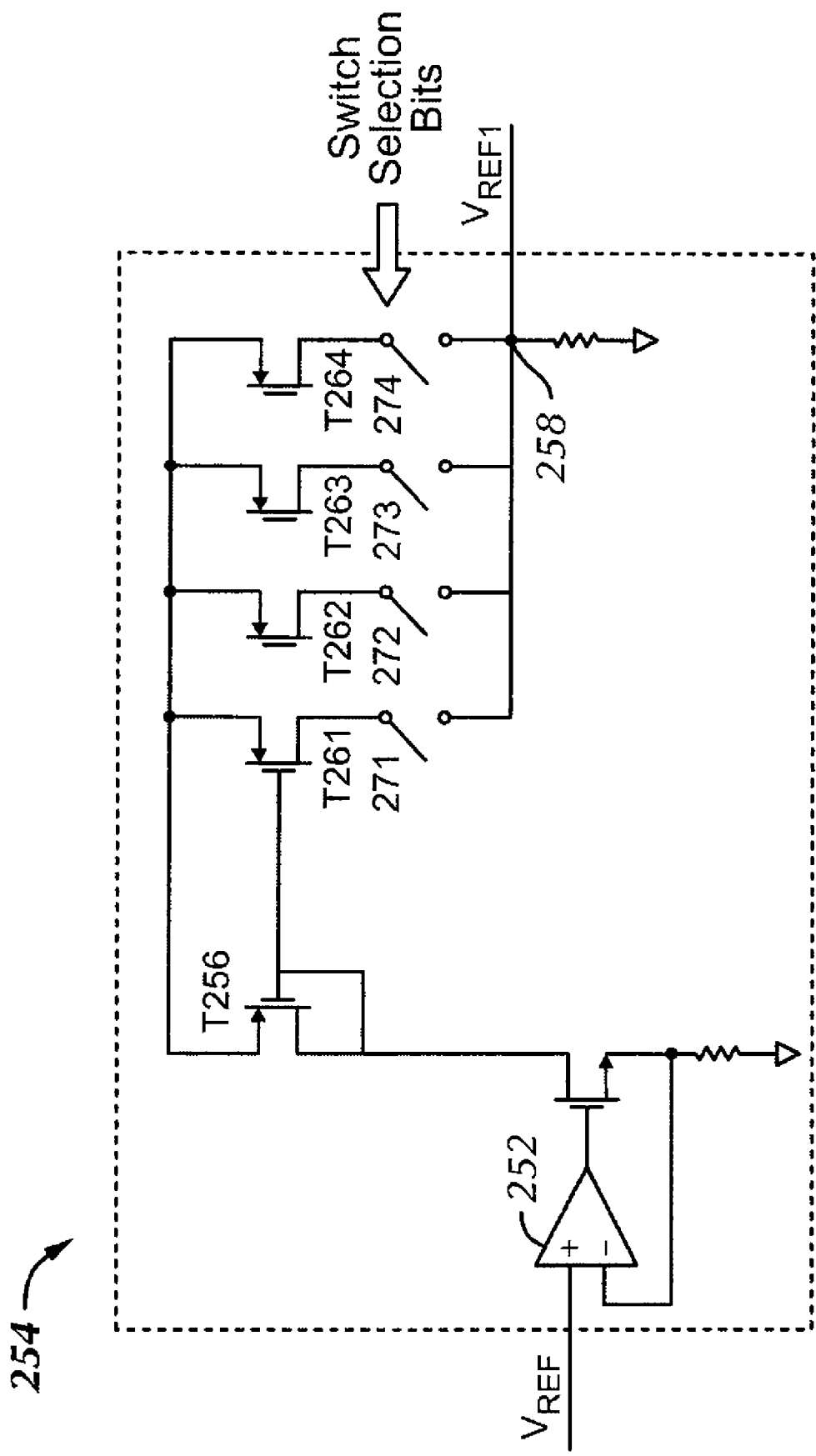
FIG. 5 is an electrical schematic diagram of one possible detailed circuit implementation of a programmable current source.

FIG. 5 shows one possible detailed circuit implementation of the first, second and third programmable current sources 214, 224, 234. Each of the programmable current sources 214, 224, 234 include an op-amp 252, a pass transistor T254, a drive transistor T256, a first selectable source transistor T261, a second selectable source transistor T262, a third selectable source transistor T263, a fourth selectable source transistor T264 and four switches 271-274. The op-amp 252 receives the reference supply voltage $V_{REF}$ and the output of the op-amp 252 drives the gate of the pass transistor T254. The op-amp 252 is configured as a buffer, but the op-amp 252 could be configured as an amplifier with the addition of feedback resistors. The drive transistor T256 is coupled to the pass transistor T254 and provides source and gate voltage to each of the first-fourth selectable source transistors T261-T264. The switches 271-274 are connected between the first-fourth selectable source transistors T261-T264 and an output node 258. The first, second or third reference voltage $V_{REF1}$-$V_{REF3}$ is output from the output node 258. The switches 271-274 can be controlled by external binary signals or can be programmed during manufacturing by jumpers or opening circuit paths, for example. Other detailed circuit implementation of the first, second and third programmable current sources 214, 224, 234 can be utilized without departing from the present invention.

Referring again to FIGS. 4A-4B, the low power output driver system 200 also includes a first voltage regulator 210 that receives reference voltage supply $V_{REF1}$ and outputs a first regulated voltage $V_{L1}$ that is derived from the reference voltage supply $V_{REF1}$, a second voltage regulator 220 that receives reference voltage supply $V_{REF2}$ and outputs a second regulated voltage $V_{L2}$ that is derived from the reference voltage supply $V_{REF2}$ and a third voltage regulator 230 that receives reference voltage supply $V_{REF3}$ and outputs a third regulated voltage $V_{L3}$ that is derived from the reference voltage supply $V_{REF3}$. The first, second and third regulated voltages $V_{L1}$, $V_{L2}$, $V_{L3}$ can be reduced, amplified or the same as the reference supply voltage $V_{REF}$. Optionally, only the first programmable current source 214 provides the first reference voltage $V_{REF1}$ to each of the first, second and third voltage regulators 210, 220, 230. Optionally, the reference supply voltage $V_{REF}$ is provided directly to each of the first, second and third voltage regulators 210, 220, 230.

There can be any number of additional voltage regulators 210, 220, 230 as a design requires. Preferably, the plurality of voltage regulators 210, 220, 230 are provided on a single integrated circuit (IC) chip (on-chip voltage power supply or regulator).

Preferably, the voltage regulators 210, 220, 230 are configured to accept a relatively wide range of input voltage $V_{in}$ while still outputting approximately the same desired regulated voltage $V_{L1}$, $V_{L2}$, $V_{L3}$. The first, second and third regulated reduced voltages $V_{L1}$, $V_{L2}$, $V_{L3}$ may be the same or different voltage potentials depending on the application.

The low power output driver system 200 also includes first low power output driver $10_{11}$, a second low power output driver $10_{21}$ and a third low power output driver $10_{31}$. Each of the first, second and third low power output drivers $10_{11}$, $10_{21}$, $10_{31}$ includes a low output driver circuit 10, 10' as described above with respect to the first preferred embodiment.

Preferably, the low power output driver system 200 includes a plurality of low output drivers $10_{11}$-$10_{1n}$, $10_{21}$-$10_{2n}$, $10_{31}$-$10_{3n}$ and each set of low output drivers $10_{11}$-$10_{1n}$, $10_{21}$-$10_{2n}$ and $10_{31}$-$10_{3n}$ is connected to a separate voltage regulator 210, 220 and 230, respectively. Since each group of low output drivers $10_{11}$-$10_{1n}$, $10_{21}$-$10_{2n}$ and $10_{31}$-$10_{3n}$ has a dedicated voltage regulator 210, 220 and 230, there is better isolation, lower noise and less external coupling.

From the foregoing, it can be seen that the present invention comprises low power output driver that utilizes a reduced input voltage. It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A low power output driver system comprising:
   (a) a reference voltage supply;
   (b) a first voltage regulator that receives the reference voltage supply and outputs a first regulated voltage;
   (c) a second voltage regulator that receives the reference voltage supply and outputs a second regulated voltage;
   (d) a first low power output driver; and
   (e) a second low power output driver, each of the first and second low power output drivers including:
      (i) a first driver input that receives a first logic signal;
      (ii) a second driver input that receives a second logic signal;
      (iii) a first driver output that outputs a first output signal;
      (iv) a second driver output that outputs a second output signal;
      (v) a first n-type metal oxide semiconductor (NMOS) having a gate, a source and a drain, the gate of the first NMOS being electrically coupled to the first driver input, the first NMOS being configured to selectively apply the respective first and second regulated voltage to the first driver output based on the first driver input;
      (vi) a second NMOS having a gate, a source and a drain, the source and the drain of the second NMOS being electrically coupled between the first driver output and an internal ground, the gate of the second NMOS being electrically coupled to the second driver input;
      (vii) a third NMOS having a gate, a source and a drain, the gate of the third NMOS being electrically coupled to the second driver input, the third NMOS being configured to selectively apply the respective first and second regulated voltage to the second driver output based on the second driver input; and
      (viii) a fourth NMOS having a gate, a source and a drain, the source and the drain of the fourth NMOS being electrically coupled between the second driver output and the internal ground, the gate of the fourth NMOS being electrically coupled to the first driver input.

2. The low power output driver system of claim 1, further comprising:
   (f) a third voltage regulator that receives the reference voltage supply and outputs a third regulated voltage;
   (g) a third low power output driver, the third low power output driver including:
      (i) a first driver input that receives the first logic signal;
      (ii) a second driver input that receives the second logic signal;
      (iii) a first driver output that outputs a first output signal;
      (iv) a second driver output that outputs a second output signal;
      (v) a first n-type metal oxide semiconductor (NMOS) having a gate, a source and a drain, the gate of the first NMOS being electrically coupled to the first driver input, the first NMOS being configured to selectively apply the third regulated voltage to the first driver output based on the first driver input;
      (vi) a second NMOS having a gate, a source and a drain, the source and the drain of the second NMOS being electrically coupled between the first driver output and an internal ground, the gate of the second NMOS being electrically coupled to the second driver input;
      (vii) a third NMOS having a gate, a source and a drain, the gate of the third NMOS being electrically coupled to the second driver input, the third NMOS being configured to selectively apply the third regulated voltage to the second driver output based on the second driver input; and
      (viii) a fourth NMOS having a gate, a source and a drain, the source and the drain of the fourth NMOS being electrically coupled between the second driver output and the internal ground, the gate of the fourth NMOS being electrically coupled to the first driver input.

3. The low power output driver system of claim 2, wherein the first, second and third regulated voltages are different voltage potentials.

4. The low power output driver system of claim 2, wherein at least two of the first, second and third regulated voltages are approximately the same voltage potential.

5. The low power output driver system of claim 1, wherein the first and second regulated voltages are different voltage potentials.

6. The low power output driver system of claim 1, wherein the first and second regulated voltages are approximately the same voltage potential.

7. The low power output driver system of claim 1, further comprising:
   a plurality of low power output drivers coupled to the first voltage regulator; and
   a plurality of low power output drivers coupled to the second voltage regulator.

8. A low power output driver system comprising:
   (a) a reference voltage supply;
   (b) a first voltage regulator that receives the reference voltage supply and outputs a first regulated voltage;
   (c) a second voltage regulator that receives the reference voltage supply and outputs a second regulated voltage;
   (d) a first low power output driver; and
   (e) a second low power output driver, each of the first and second low power output drivers including:
      (i) a first driver input that receives a first logic signal;
      (ii) a second driver input that receives a second logic signal;
      (iii) a first driver output that outputs a first output signal;
      (iv) a second driver output that outputs a second output signal;
      (v) a first n-type metal oxide semiconductor (NMOS) having a gate, a source and a drain, the gate of the first NMOS being electrically coupled to the first driver input, the first NMOS being configured to selectively apply the respective first and second regulated voltage to the first driver output in response to the first driver input;

(vi) a second NMOS having a gate, a source and a drain, the source and the drain of the second NMOS being electrically coupled between the first driver output and a constant voltage internal ground, the gate of the second NMOS being electrically coupled to the second driver input;

(vii) a third NMOS having a gate, a source and a drain, the gate of the third NMOS being electrically coupled to the second driver input, the third NMOS being configured to selectively apply the respective first and second regulated voltage to the second driver output in response to the second driver input; and (viii) a fourth NMOS having a gate, a source and a drain, the source and the drain of the fourth NMOS being electrically coupled between the second driver output and the constant voltage internal ground, the gate of the fourth NMOS being electrically coupled to the first driver input, when the first driver input is high and the second driver input is low, the first NMOS and the fourth NMOS are gated on, the first driver output is raised to the respective one of the first and second regulated voltage and the second driver output is pulled down to the constant voltage internal ground, and when the second driver input is high and the first driver input is low, the second NMOS and the third NMOS are gated on, the second driver output is raised to the respective one of the first and second regulated voltage and the first driver output is pulled down to the constant voltage internal ground.

9. The low power output driver system of claim 8, further comprising:

(f) a third voltage regulator that receives the reference voltage supply and outputs a third regulated voltage;

(g) a third low power output driver, the third low power output driver including:

(i) a first driver input that receives the first logic signal;
(ii) a second driver input that receives the second logic signal;
(iii) a first driver output that outputs a first output signal;
(iv) a second driver output that outputs a second output signal;
(v) a first n-type metal oxide semiconductor (NMOS) having a gate, a source and a drain, the gate of the first NMOS being electrically coupled to the first driver input, the first NMOS being configured to selectively apply the third regulated voltage to the first driver output in response to the first driver input;

(vi) a second NMOS having a gate, a source and a drain, the source and the drain of the second NMOS being electrically coupled between the first driver output and an internal ground, the gate of the second NMOS being electrically coupled to the second driver input;

(vii) a third NMOS having a gate, a source and a drain, the gate of the third NMOS being electrically coupled to the second driver input, the third NMOS being configured to selectively apply the third regulated voltage to the second driver output in response to the second driver input; and (viii) a fourth NMOS having a gate, a source and a drain, the source and the drain of the fourth NMOS being electrically coupled between the second driver output and the internal ground, the gate of the fourth NMOS being electrically coupled to the first driver input, when the first driver input is high and the second driver input is low, the first NMOS and the fourth NMOS are gated on, the first driver output is raised to the third regulated voltage and the second driver output is pulled down to the constant voltage internal ground, and when the second driver input is high and the first driver input is low, the second NMOS and the third NMOS are gated on, the second driver output is raised to the third regulated voltage and the first driver output is pulled down to the constant voltage internal ground.

10. The low power output driver system of claim 9, wherein the first, second and third regulated voltages are different voltage potentials.

11. The low power output driver system of claim 9, wherein at least two of the first, second and third regulated voltages are approximately the same voltage potential.

12. The low power output driver system of claim 8, wherein the first and second regulated voltages are different voltage potentials.

13. The low power output driver system of claim 8, wherein the first and second regulated voltages are approximately the same voltage potential.

14. The low power output driver system of claim 8, further comprising:

a plurality of low power output drivers coupled to the first voltage regulator; and
a plurality of low power output drivers coupled to the second voltage regulator.

* * * * *